Nov. 17, 1953 P. ROBINSON 2,659,820

TUNING ASSEMBLY

Filed July 25, 1951

INVENTOR.
PRESTON ROBINSON
BY

HIS ATTORNEYS

Patented Nov. 17, 1953

2,659,820

UNITED STATES PATENT OFFICE 2,659,820

TUNING ASSEMBLY

Preston Robinson, Williamstown, Mass., assignor to Sprague Electric Company, North Adams, Mass., a corporation of Massachusetts Application July 25, 1951, Serial No. 238,410

5 Claims. (Cl. 250—40)

Figure 1:
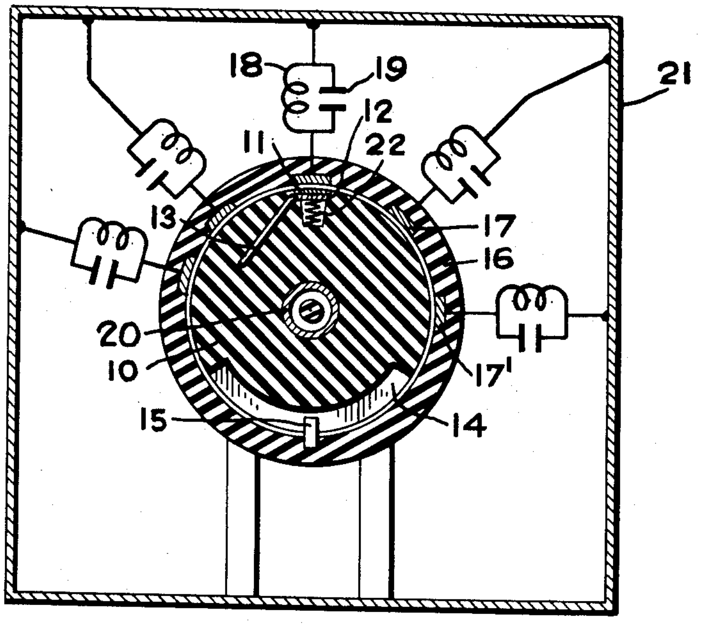

This invention relates to improved switching devices, and more particularly refers to improved high frequency communications band switching devices.

Band switching for high frequency communication tuning purposes is usually accomplished by a mechanical switching arrangement employing snap switches, wiping switches and the like. For television tuning it has been found necessary to provide a switch contact with very high contact pressure, in order to form a low resistance path capable of carrying various current and voltage levels without appreciable loss. This is readily accomplished by the use of heavy spring loaded switches and similar mechanical contrivances. Unfortunately, however, the result of such mechanical assistance has been that the operator must apply a very high torque to the switching knob or switch axis. This is not only physically undesirable, but it leads to vibration of and mechanical shock to the various tuned circuit elements in the tuner. As a result frequent adjustments and repairs are necessitated.

In addition to the television tuning referred to above, numerous other electrical circuits require switches designed to permit high current flow with minimum loss, that may be actuated by a small, mechanical energy input.

It is an object of the present invention to overcome the foregoing and related disadvantages of the prior switching devices. A further object is to produce an improved switch assembly. A still further object is to produce new and improved high frequency tuning apparatus for communications equipment. Additional objects will become apparent from the following description and claims.

These objects are attained in accordance with the present invention by constructing a switch comprising at least one highly conducting metal element, a semi-conducting element and means for contacting said elements.

In a more restricted sense the invention is concerned with a tuning assembly comprising a plurality of tuned circuits, each of which is provided with a polished metal contact element, a polished semi-conducting contact element, means to place said semi-conducting contact element against each of said metal contact elements successively and means to apply circuit voltage thereto.

In one of its limited embodiments the invention relates to a high frequency switch assembly comprising a plurality of polished metal faces, a single polished semi-conducting face having a metal backing, the product of the thickness of said semi-conducting face times the contact area thereof being between about 0.1 cubic inch and about 0.00001 cubic inch, means to register said semi-conducting face against each of said metal faces successively, and means to apply circuit voltage thereto.

In one of its preferred embodiments the invention concerns a high frequency tuning assembly comprising a plurality of tuned circuits mounted in a drum, each of said circuits being provided with a polished metal insert in the outer periphery of said drum, a fixed outer contact resting against a portion of the outer periphery of said drum, said outer contact comprising a thin section of semi-conducting material, means for rotating said drum about its axis to bring said metal inserts into contact successively with said semi-conducting material, and means for applying circuit voltage to registering contact faces.

In another of its preferred embodiments, the invention concerns a high frequency tuning assembly comprising a grounded metal enclosure containing a plurality of parallel tuned circuits, one terminal of each of which is connected to said enclosure, and the other terminal of each of which is connected to a polished metal insert in the inner periphery of a cylinder of insulating material, a closely fitting drum of insulating material rotatably mounted within said cylinder, a semi-conducting mass embedded in the outer periphery of said drum, so that it may successively register against each of said metal inserts, and means for applying circuit voltage to said semi-conducting mass, when it registers upon the metal insert of the desired tuned circuit.

The broad concept of my invention resides in a switch gear assembly whose switch contact resistance is made extremely low without the necessity of heavy spring loading and other mechanical contraptions required for ordinary low resistance contacts. In order to accomplish this, I employ a combination of switch facing, materials such that pronounced electrostatic adherence results between two contacting ground and/or polished faces under application of the circuit voltage. For this purpose, one of said contact faces should be composed of a metal, such as copper or silver, and the other of a semi-conducting material.

The obtaining of an "electrostatic adhesion" or Johnsen-Rohbek effect is one well known in the art to exist between contacting conductive and non-inductive elements across which a potential is applied.

The semi-conducing contact face is selected from those materials which exhibit an electrostatic adherence to a facing metal surface upon application of voltage. A large number of semi-conductors are useful for this purpose, and the particular selection is generally made on the basis of other characteristics of the semi-conductor, e. g. its abrasion resistance, stability, insensitivity to moisture and electrolysis, etc. Among the semi-conducting materials suggested for use herein are the following:

| | |
|---|---|
| Titanium oxides | Spinels |
| Magnesium oxides | Peroffskites |
| Manganese oxides | Titanates |
| Nickel oxides | Lead sulfide |
| Zinc oxides | Lead selenide |
| Copper oxides | Stannous sulfide |
| Cobalt oxides | Chromium sulfide |
| Uranium oxides | Cerium tungstate |
| Chromium oxides | Molybdenum disulfide |

It is preferred that the semi-conducting material be characterized by pure electronic conduction, as opposed to ionic conduction. The various oxides referred to above are usually in a "lower" state of oxidation, as results from removal of a small proportion of combined oxygen. Among the preferred semi-conducting masses employed in accordance with the present invention are $MgO.TiO_n$ where $n$ represents an integer between about 1.8 and 1.99995 cupric oxide, cerium tungstate, and the like. For the television tuning devices of the invention, it is generally preferable to employ a semi-conducting mass whereof a thin section may be employed without impairment of the mechanical stability of the device. In this way the series impedance due to the switch gear is minimized.

In accordance with one of the preferred embodiments of the invention, the use of semi-conducting masses in the switch gear assembly can be utilized to control the effective "Q" of the tuning circuit, and thus the band width passed by the particular circuit employed for a given setting on the tuning device. Thus the band width may be fixed by the nature of the semi-conducting mass, the thickness of the mass, and the contact area of the mass.

According to another embodiment of the invention the central or inner tuning drum consists of a plurality of individual tuned circuits printed on and fired into a low loss ceramic drum. The individual tuned circuits are each contacted through a separate ground and polished metal facing inserted in the outer periphery of the inner drum, to an outer facing consisting of a semi-conducting mass of the type described herein.

Reference is now made to the appended drawing wherein

Figure 2:
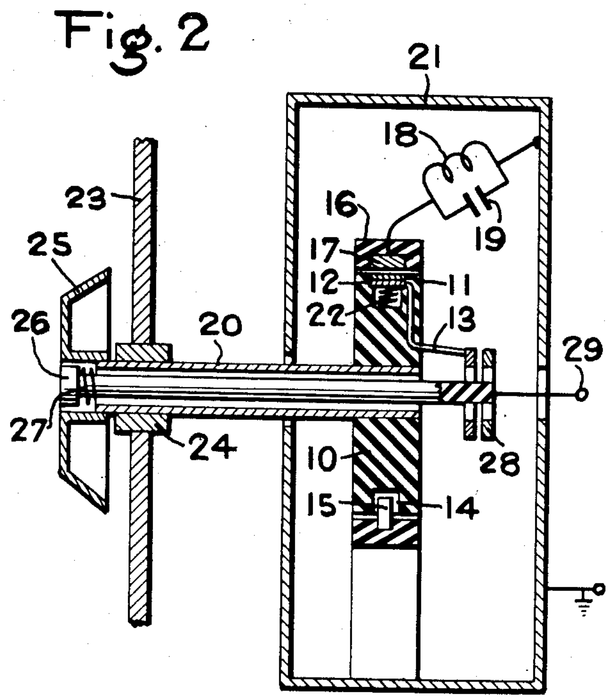
Figure 3:
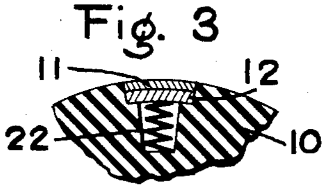
Figure 4:
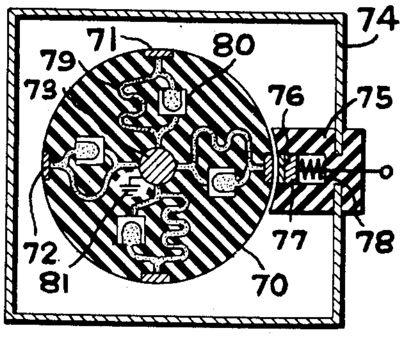

Figures 1, 2 and 3 show partially schematic views of one of the tuning devices of the invention, and Figure 4 shows a partially schematic cross-section of another of the tuning devices of the invention.

Figure 1 shows a simplified rear view of one of the tuning elements of the invention. 10 represents an inner drum of insulating material, mounted on shaft 20. In the periphery of drum 10 there is mounted a thin section of semi-conducting material 11 bonded to a metal backing 12. This metal backing is connected by means of a flexible cable 13 to the external circuit, as best shown in Figure 2. It is to be noted that the brush-shaped semi-conductor 11 is forced outward against an outer cylinder 16 by means of a light spring 22. The use of this spring is optional and desirable only when the fit between the inner drum and the outer cylinder is relatively loose. The outer cylinder 16 consists of insulating material in the inner periphery of which are inserted a plurality of metal contact faces 17, 17', etc. These are metal conductors, each of which is connected as one terminal of the parallel tuned circuit members, each comprising an inductor 18 and capacitor 19. These elements are usually connected in parallel, and the other terminal is connected to ground, as represented by a metal enclosure shield 21. Unrestricted rotation of drum 10 is prevented by means of a groove 14 in drum 10 and a guide pin 15, set in the outer cylinder 16.

Figure 2 shows a side view in partial cross-section of the tuning device of Figure 1. The inner drum 10 is mounted on a rotatable shaft 20 which is connected to the tuning dial 25. The shaft 20 is led through a control panel or dash 23 through a bearing 24. The semi-conductor insert 11 in the inner drum 10 is connected by means of the cable 13 and switch 28 to a circuit lead 29. The switch is actuated by a button 26 that is spring loaded with spring 27 and located within the shaft 20 and dial 25. When the dial is being turned, button 26 is depressed, so that the semi-conductor 11 will not electrostatically adhere to each metal insert 17. When the dial indicates that the semi-conductor insert is facing the desired metal insert in the outer drum, the push-button is released and current flows through the junction of the semi-conductor and conductor, resulting in a strong attachment and correspondingly low contact resistance.

Figure 3 shows a greatly enlarged cross section of a portion of a drum, such as is used in the tuner of Figures 1 and 2. The semi-conductor insert 11 is provided with a metallized, soldered, silvered or other highly conducting metal backing 12. The unit thus produced is mounted in insulation 10, which forms a part of the drum, and may be provided with a light spring loading 22, to insure initial contact between the semi-conductor element and the opposing metal insert in the outer cylinder.

Figure 4 shows a simplified side view of another form of drum-type tuner embodying the invention. 70 represents the inner drum in the outer periphery of which are inserted a plurality of metal inserts, such as 71, 72, etc. These inserts are connected to inductance and capacitance elements 79 and 80, respectively. The latter may be mounted within the drum in grooves or other spaces provided therefor. In some instances, as shown, the inductance and capacitance elements may be produced by silvering and insulating various portions of the drum to produce the desired inductance and capacitance. The other terminals of the tuning circuits are connected in common to the shaft 73, which may be grounded or otherwise connected into the circuit, preferably with a fixed (flexible cable) contact, as indicated by 81. The outer contact is mounted in an insulating segment 75, which in turn is mounted on the chassis or a tuner shield box 74. A semi-conductor insert 76 with a conductor backing 77 are so mounted in insulation 75 as to face against the inner drum 70. A light spring loading 78 may be provided, if so desired.

While the drawings are particularly concerned with single stage tuning arrangements, it is to be understood that multi-stage tuning may be similarly enhanced by the means disclosed herein. Multi-stages may be mounted on the same drum, in different segments thereof, or on drums arranged in tandem with a tuner box, using the same shaft. The invention is particularly suited to the so-called printed circuit structures, in that the essential elements of the invention may be heated, mechanically handled, etc. without damage.

The metal insert used as a facing against the semi-conductor insert is preferably an excellent conductor of electricity. Silver is the preferred material; however, copper and other metals may be used. For minimum expense, a heavily silver-plated copper facing is desirable. The metal insert should be carefully ground and polished to offer a smooth and uniform surface for current flow.

The semi-conductor should likewise be ground and/or polished to a smooth uniform surface. The semi-conductor material should be selected from the class of such materials possessing appreciable resistance to abrasion, in order that the life of the tuning assembly may be extended. The thickness of the semi-conductor is usually not large, in order that the series resistance resulting from its use be not great. However, the thickness is also dependent upon the total facing area, since the larger facing areas result in lower overall switch resistance. As a general rule, I prefer to have a facing area and a semi-conductor thickness such that the product of these two, expressed in cubic inches, is between about 0.1 cubic inch and about 0.00001 cubic inch.

The switch design may also be flat or otherwise shaped, instead of a cylindrical or drum design.

As many apparently widely different embodiments of this invention may be made without departing from the spirit and scope hereof, it is to be understood that the invention is not limited to the specific embodiments hereof, except as defined in the appended claims.

I claim:

1. A tuning assembly comprising a plurality of tuned circuits, each of which is provided with a polished metal contact element, a polished semi-conducting contact element, means to place said semi-conducting contact element against each of said metal contact elements successively and means to apply circuit voltage thereto.

2. A high frequency switch assembly comprising a plurality of polished metal faces, a single polished semi-conducting face having a metal backing, the product of the thickness of said semi-conducting face times the contact area thereof being between about 0.1 cubic inch and about 0.00001 cubic inch, means to register said semi-conducting face against each of said metal faces successively and means to apply circuit voltage thereto.

3. A high frequency tuning assembly comprising a plurality of tuned circuits mounted in a drum, each of said circuits being provided with a polished metal insert in the outer periphery of said drum, a fixed outer contact resting against a portion of the outer periphery of said drum, said outer contact comprising a thin section of semi-conducting material, means for rotating said drum about its axis to bring said metal inserts into contact successively with said semi-conducting material, and means for applying circuit voltage to registering contact faces.

4. A high frequency tuning assembly comprising a grounded metal enclosure containing a plurality of parallel tuned circuits, one terminal of each of which is connected to said enclosure, and the other terminal of each of which is connected to a polished metal insert in the inner periphery of a cylinder of insulating material, a closely fitting drum of insulating material rotatably mounted within said cylinder, a semi-conducting mass embedded in the outer periphery of said drum, so that it may successively register against each of said metal inserts, and means for applying circuit voltage to said semi-conducting mass, when it registers upon the metal insert of the desired tuned circuit.

5. The high frequency switch assembly of claim 3 wherein the semi-conducting material comprises $MgO.TiO_n$ where $n$ represents an integer from about 1.80 to about 1.99995.

PRESTON ROBINSON.

References Cited in the file of this patent

UNITED STATES PATENTS

| Number | Name | Date |
|---|---|---|
| 158,787 | Edison | Jan. 19, 1875 |
| 1,446,748 | Johnsen et al. | Feb. 27, 1923 |
| 1,553,757 | Rahbek et al. | Apr. 14, 1925 |
| 1,937,099 | Stewart | Nov. 28, 1933 |
| 2,015,874 | Schofield | Oct. 1, 1935 |
| 2,025,123 | Rahbek | Dec. 24, 1935 |
| 2,568,824 | Rahbek | Sept. 25, 1951 |